United States Patent [19]
Yamada

[11] Patent Number: 6,030,485
[45] Date of Patent: Feb. 29, 2000

[54] METHOD AND APPARATUS FOR MANUFACTURING A SEMICONDUCTOR DEVICE

[75] Inventor: Yutaka Yamada, Kawasaki, Japan

[73] Assignee: Fujitsu Limited, Kawasaki, Japan

[21] Appl. No.: 09/037,003

[22] Filed: Mar. 9, 1998

[30] Foreign Application Priority Data

Aug. 25, 1997 [JP] Japan ................................ 9-228547

[51] Int. Cl.[7] .................................................. B32B 35/00
[52] U.S. Cl. ......................... 156/344; 156/154; 156/584; 438/759
[58] Field of Search ..................... 156/154, 344, 156/584; 29/426.1, 426.3, 426.4, 426.5, 426.6; 438/759

[56] References Cited

U.S. PATENT DOCUMENTS

| | | | |
|---|---|---|---|
| 5,268,065 | 12/1993 | Grupen-Shemansky | 156/154 X |
| 5,476,566 | 12/1995 | Cavasin | 156/154 X |
| 5,480,842 | 1/1996 | Clifton et al. | 438/464 |
| 5,840,614 | 11/1998 | Sim et al. | 438/464 |

FOREIGN PATENT DOCUMENTS 61-1037   1/1986   Japan ............................ 438/FOR 386

*Primary Examiner*—Mark A. Osele
*Attorney, Agent, or Firm*—Armstrong, Westerman, Hattori, McLeland & Naughton

[57] ABSTRACT

An apparatus for manufacturing a semiconductor device includes a wafer grinding section which grinds a wafer fixed on an ultraviolet sensitive tape and a drying section which dries the wafer after the wafer is ground. The drying section includes an ultraviolet irradiation device irradiating the ultraviolet sensitive tape with ultraviolet rays.

9 Claims, 7 Drawing Sheets

METHOD AND APPARATUS FOR MANUFACTURING A SEMICONDUCTOR DEVICE

BACKGROUND OF THE INVENTION

1. Field of the Invention

The present invention generally relates to a method and an apparatus for manufacturing a semiconductor device, and particularly relates to a method and an apparatus for manufacturing a semiconductor device for implementing a wafer grinding process on a wafer fixed on an adhesive tape.

2. Description of the Related Art

A semiconductor manufacturing process includes a wafer process and a subsequent wafer grinding process. In the wafer process, semiconductor elements are formed on one surface (a front surface) of a wafer. In the wafer grinding process, the other surface (a back surface) of the wafer, without any semiconductor element, is ground so as to reduce a thickness of a wafer. However, it is difficult to handle the wafer with reduced thickness since the wafer may easily break.

Accordingly, a method and an apparatus for manufacturing a semiconductor device is required, which makes it easier to handle the wafer with reduced thickness and can prevent the breakage of the wafer.

Also, because the semiconductor manufacturing process is ever complex, more devices are required for manufacturing semiconductors. Therefore, there is a need for improving space efficiency of a semiconductor device manufacturing plant. Thus, further miniaturization of the apparatus for manufacturing semiconductors is also required.

Referring now to FIGS. 1–6, a method and an apparatus of the related art for manufacturing a semiconductor device will be described. FIG. 1 shows a prior device structure for a back grinding process that performs wafer grinding on the back surface of the wafer. FIGS. 2–6 show a method of implementing a prior back grinding process.

As shown in FIG. 1, in the prior back grinding process, the back grinding process is performed on a wafer 14 using a supply cassette 2, a storage cassette 4, a transfer machine 6, a wafer grinder 8, an ultraviolet (UV) irradiation device 10 and a remover 12. Hereinafter, each of the above devices will be described in its operation.

The supply cassette 2 is preloaded with the wafer 14 provided with an ultraviolet sensitive tape 16 (herein after referred to as a UV tape) on the front surface as shown in FIG. 2 (tape laminated). The transfer machine 6 extracts the wafer 14 provided with the UV tape 16 from the supply cassette 2 and transfers it to the wafer grinder 8.

The wafer grinder 8 is generally formed of a wafer grinding section 18 and a drying section 20. First, as shown in FIG. 3, the transfer machine 6 fixes the wafer 14 on a chuck table 28 provided in the wafer grinding section 18. The chuck table 28 is connected to a vacuum device so as to hold the wafer 14 on the chuck table 28 by vacuum. The wafer 14 is fixed on the chuck table 28 with the UV tape 16 placed at the bottom.

Subsequently, a grinding process (back grinding process) is performed until the wafer 14 has a required thickness. A grinding tool 22 comes into contact with the back surface (a surface with no element and provided with the UV tape) of the wafer 14 and then rotates to carry out this grinding process. In order to remove scraps and to cool the wafer 14, cleaning liquid is supplied to the surface subjected to the grinding process.

After being subjected to the grinding process at the wafer grinding section 18, the wafer 14 is transferred to the drying section 20 by the transfer machine 6. Then as shown in FIG. 4, the cleaning liquid is dried using a light source 24 such as a halogen lamp.

As described above, after the back grinding process and the drying process on the wafer 14 in the wafer grinder 8, the transfer machine 6 extracts the wafer 14 from the wafer grinder 8 and then transfers the wafer 14 to the UV irradiation device 10. As shown in FIG. 5, the UV tape 16 is irradiated with ultraviolet (UV) rays from an ultraviolet (UV) lamp 26.

A characteristic feature of an adhesive agent provided on the UV tape 16 is that it becomes stiff when irradiated with the ultraviolet rays. Thus by irradiating the UV tape 16 with the ultraviolet rays, the adhesive agent will become less adhesive. This facilitates the removal of the UV tape from the wafer 14.

As shown above, after irradiating the wafer 14 with the ultraviolet in the UV irradiation device 10, the transfer machine 6 extracts the wafer 14 from the UV irradiation device 10 and then transfers the wafer 14 to the remover 12. As shown in FIG. 6, the UV tape 16 is peeled off from the wafer 14 in the remover 12.

In the related art, the back grinding process is implemented on the wafer 14 using devices 2–12 and processes described above.

However, in the related art, devices such as the transfer machine 6, the wafer grinder 8, the UV irradiation device 10 and the remover 12 were required separately in order to perform the back grinding process. Also, there was a need for the transfer machine 6 in order to mount and extract the water 14 between each of devices 6–12.

Accordingly, it was necessary to provide a large number of devices 8–12 within a semiconductor manufacturing plant and to connect those devices 8–12 via a transfer machine 6. Therefore, there was a problem that a large installation space was needed within the plant.

Also, the transfer machine 6 mounts and extracts the wafer 14 between each device 2–12. Therefore, a considerable time is required between the extraction of the wafer 14 with the UV tape from the supply cassette 2 and the irradiation of the UV tape 16 at the UV irradiation device 10. This can cause a problem since the adhesiveness of the UV-sensitive adhesive agent provided on the UV tape may also change due to radiation from a fluorescent lamp.

Particularly, when a considerably long time is required before ultraviolet irradiation of the UV tape 16 as in the related art, the property of the adhesive agent will be greatly changed by a fluorescent lamp. Accordingly, the adhesive agent will not be sufficiently stiff when the UV tape 16 is irradiated by the ultraviolet in the UV irradiation device 10. This causes a problem that the adhesive agent may remain on the wafer 14 when peeling off the UV tape 16 from the wafer 14 by the remover 12.

Any residual adhesive agent on the wafer 14 will be inconvenient in the following manufacturing process for the semiconductor device. Therefore, in the related art, there was a need for a cleaning process after the removing process for removing any residual adhesive agent. This introduced an additional complexity to the process of manufacturing the semiconductor device.

SUMMARY OF THE INVENTION

Accordingly, it is a general object of the invention to provide a method and an apparatus for manufacturing a semiconductor device, which can satisfy the needs described above.

It is another and more specific object of the present invention to provide a method and an apparatus for manufacturing a semiconductor device which can positively peels off an ultraviolet sensitive tape (UV tape) from the wafer and can reduce the installation space requirement.

In order to achieve the above objects according to the present invention, an apparatus for manufacturing a semiconductor device includes:

a wafer grinding section which grinds a wafer fixed on an ultraviolet sensitive tape; and a drying section which dries the wafer after the wafer is ground, wherein the drying section includes an ultraviolet irradiation device irradiating the ultraviolet sensitive tape with ultraviolet rays.

In the apparatus described above, the wafer grinding section implements the wafer grinding process to the wafer fixed to the UV tape so as to grind the wafer to a required thickness. During the wafer grinding process, the wafer will not be damaged since the wafer is protected by the UV tape fixed thereon. Subsequently, the drying process is implemented on the wafer in order to dry the cleaning liquid used during the wafer grinding.

Also, the ultraviolet irradiation device for irradiating the UV tape with ultraviolet rays is integrated in the drying section. Thereby the ultraviolet-sensitive adhesive agent provided on the UV tape may become stiff at an early stage after the wafer grinding process. Since the wafer grinding section and the drying section are provided within the same manufacturing apparatus, light such as light from a fluorescent lamp may not act on the adhesive agent provided on the UV tape.

Accordingly, the adhesive agent does not remain on the wafer when peeling off the UV tape from the wafer. Therefore, a cleaning process for removing the residual adhesive agent is no longer necessary. Thus, the semiconductor device manufacturing process may be simplified.

Further, the ultraviolet irradiation device is integrated in the drying section. This miniaturizes the apparatus for manufacturing the semiconductor device as compared to the prior manufacturing apparatus, which included separate ultraviolet irradiation devices. Thereby, an installation space of the manufacturing apparatus may be reduced within a semiconductor device manufacturing plant.

It is still another object of the invention to provide an apparatus for manufacturing a semiconductor device, which can implement the drying process and the ultraviolet irradiation process simultaneously and can improve the efficiency of semiconductor device manufacturing process.

In order to achieve the above object, the ultraviolet irradiation device is provided so as to oppose a predetermined wafer drying position within the drying section.

It is yet another object of the invention to provide an apparatus for manufacturing a semiconductor device, which can improve the efficiency of the drying process.

In order to achieve the above object, the drying section further includes a chuck table mounting the wafer, the chuck table having a surface area smaller than that of the wafer. Also, the drying section further includes a holder that holds the wafer at a predetermined distance above the chuck table during the drying process.

It is yet another object of the invention to provide an apparatus for manufacturing a semiconductor device which can transfer the wafer without exposing the wafer to light such as light from a fluorescent lamp adversely acting on the adhesive agent provided on the UV tape.

In order to achieve the above object, the apparatus for manufacturing a semiconductor further includes a transfer machine that automatically transfer the wafer from the wafer grinding section to the drying section within the apparatus.

It is yet another object of the invention to provide a method and an apparatus for manufacturing a semiconductor device which can reduce the time required for the manufacturing process as compared to the related art which implements each process separately.

In order to achieve the above object, the ultraviolet irradiation device includes both an ultraviolet lamp and a halogen lamp. Also, a method of manufacturing a semiconductor using the above described apparatus for manufacturing a semiconductor device includes the step of irradiating the ultraviolet sensitive tape with ultraviolet rays while drying the wafer.

It is yet another object of the invention to provide a method and an apparatus for manufacturing a semiconductor device, which can reduce an installation space of the manufacturing apparatus within a semiconductor device manufacturing plant, when compared to the related art.

In order to achieve the above object, the drying section further includes a remover which peels off the ultraviolet sensitive tape from the wafer, the ultraviolet sensitive tape having been irradiated with ultraviolet rays by the ultraviolet irradiation device and having become stiff. Also, the method of manufacturing a semiconductor further includes the step of peeling off the ultraviolet sensitive tape from the wafer after the irradiation step.

Other objects and further features of the present invention will be apparent from the following detailed description when read in conjunction with the accompanying drawings.

DETAILED DESCRIPTION OF THE PREFERRED EMBODIMENTS

In the following, a principle and an embodiment of the present invention will be described with reference to the accompanying drawings.

Figure 1:
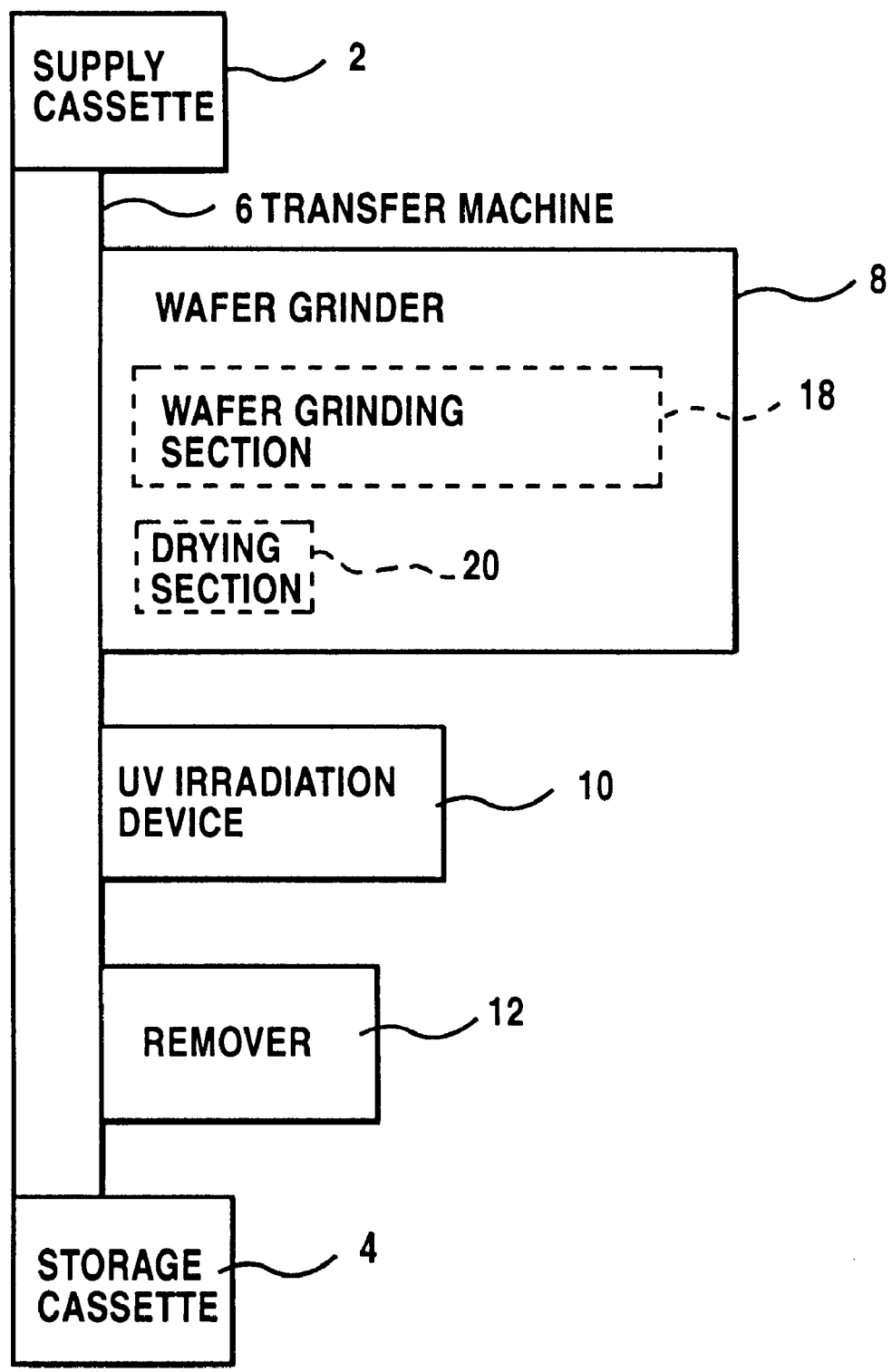
FIG. 1 is a diagrammatic view of a device used in a back grinding process of the related art.
Figure 2:
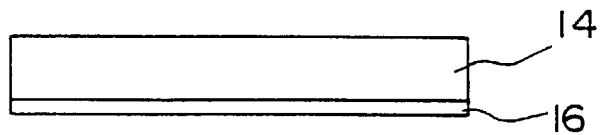
FIG. 2 is a cross sectional diagram of a wafer before a wafer grinding process.
Figure 3:
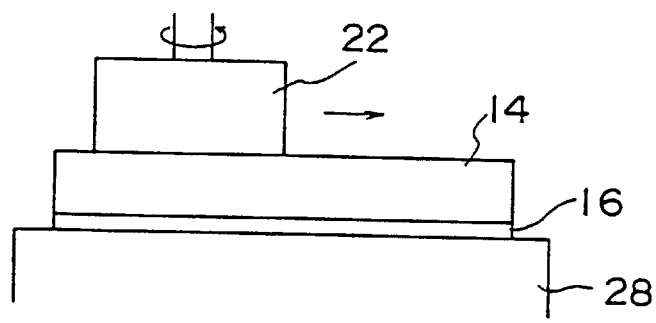
FIG. 3 is a cross sectional diagram of a wafer under a wafer grinding process.
Figure 4:
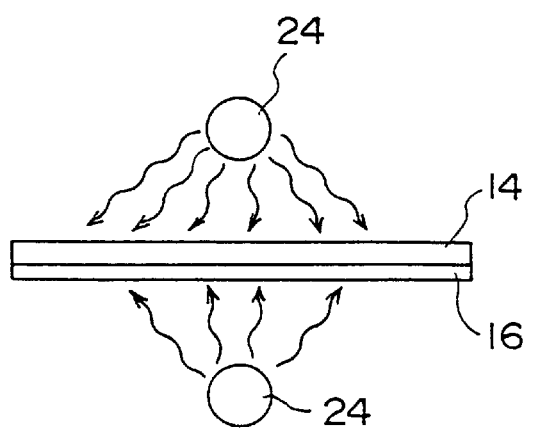
FIG. 4 is a diagram showing an operation of the drying section of the related art.
Figure 5:
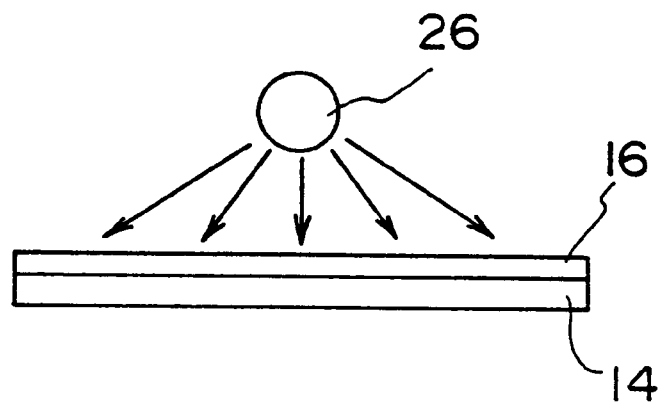
FIG. 5 is a diagram showing an operation of the UV radiation device of the related art.
Figure 6:
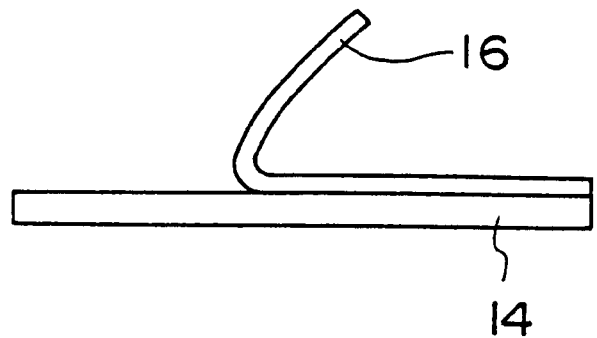
FIG. 6 is a diagram showing an operation of the remover of the related art.
Figure 7:
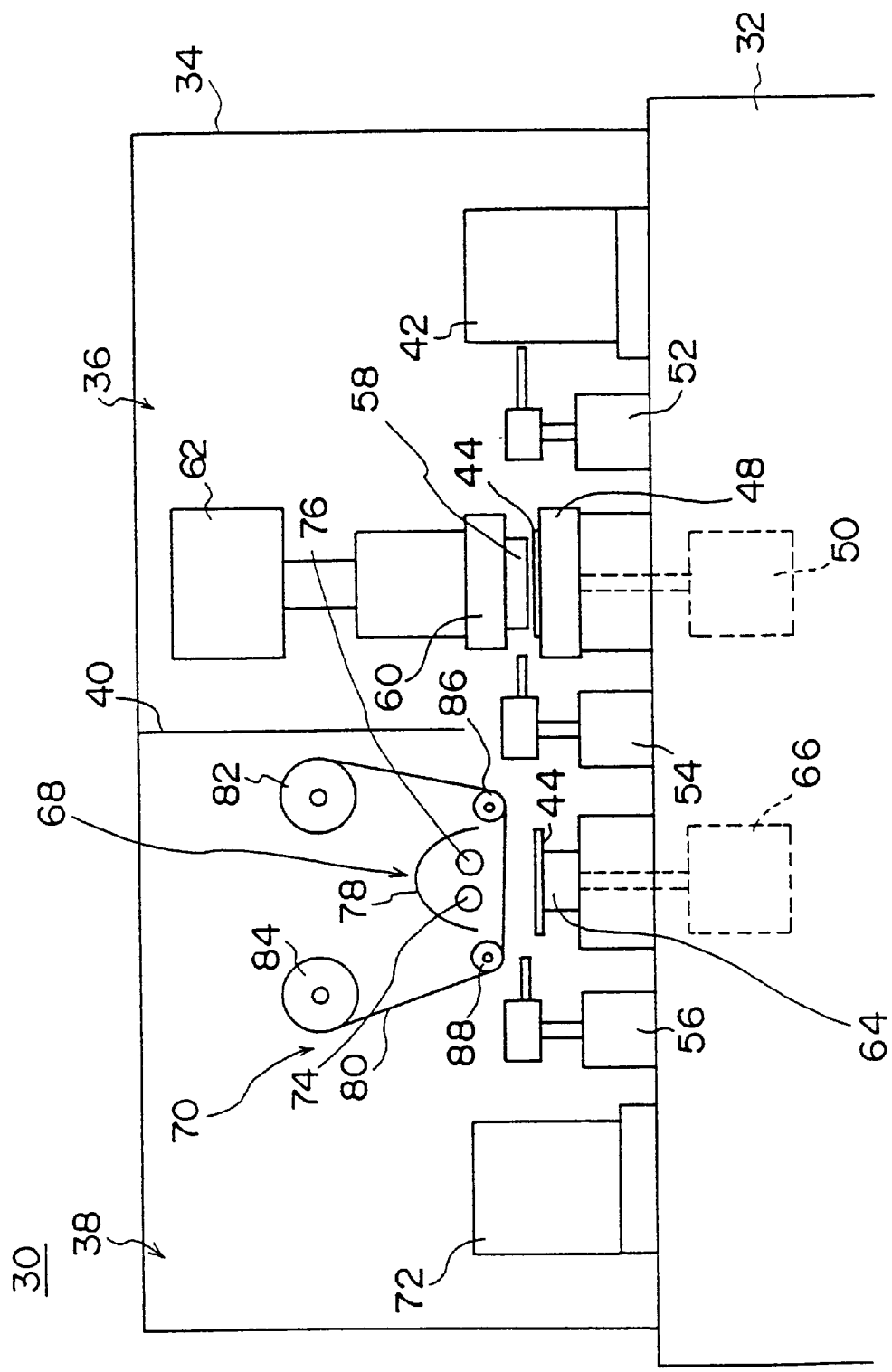
FIG. 7 is a diagrammatic view of a semiconductor device manufacturing apparatus of an embodiment of the present invention.

FIG. 7 shows a semiconductor device manufacturing apparatus 30 of an embodiment of the present invention.

This manufacturing apparatus 30 is used for a back grinding process which performs wafer grinding on the back surface of a wafer 44. Hereinafter the manufacturing apparatus 30 is referred to as a wafer grinder 30. FIGS. 8–12 show a method of implementing the back grinding process using the wafer grinder 30.

In the following, the structure of the wafer grinder 30 and a method of implementing the back-grinding process using the wafer grinder 30 will be described.

The wafer grinder 30 includes a cover 34 provided on a base 32. A partition 40 at the central part of the cover 34 divides the cover 34 into two chambers, the two chambers referred to as a wafer grinding section 36 and a drying section 38, respectively.

In general, the wafer grinding section 36 may include devices such as a supply cassette 42, a first chuck table 48, a first vacuum device 50, a first transfer machine 52, a grinding tool 58 and a drive 62.

Figure 8:
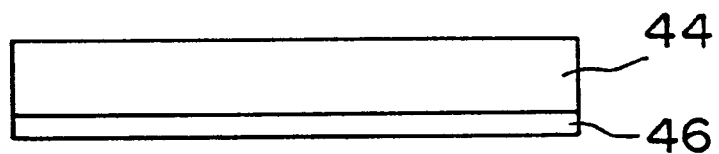
FIG. 8 is a cross sectional diagram of a wafer before a wafer grinding process according to the present invention.

The supply cassette 42 is preloaded with a plurality of wafers 44. Each wafer 44 is provided with an ultraviolet sensitive tape 46 (herein after referred to as a UV tape) on the surface (a front surface) having elements formed thereon as shown in FIG. 8 (tape laminated). Before the back grinding process, the wafer 44 has a thickness of 750 μm and the UV tape 46 has a thickness of 200 μm. Also, an ultraviolet-sensitive adhesive agent (not shown), which has a thickness of approximately 30 μm, is provided on the UV tape.

The first transfer machine 52 extracts the wafer 44 having the UV tape 46 from the supply cassette 42, and then transfers the wafer 44 to the first chuck table 48. The first transfer machine 52 transfers the wafer 44 such that the surface provided with the UV tape 46 opposes the first chuck table 48.

The first chuck table 48 is, for example a porous chuck table. When connected to the first vacuum device 50, the first chuck table 48 can hold the wafer 44 by vacuum to the table. When the wafer 44 is fixed on the first chuck table 48 as described above, the first vacuum device 50 starts a vacuum operation so that the wafer 44 may be fixed on the first chuck table 48.

A grinding tool 58 (grindstone) is provided at the top of the first chuck table 48. This grinding tool 58 is, for example a diamond wheel and is mounted on a wheel 60 connected to the drive 62. In the present embodiment, the grinding tool 58 is rotated so as to implement the back grinding process on the wafer 44. Therefore, the drive 62 includes devices such as a motor for rotating the grinding tool 58 and a lift for raising/lowering the grinding tool 58.

Figure 9:
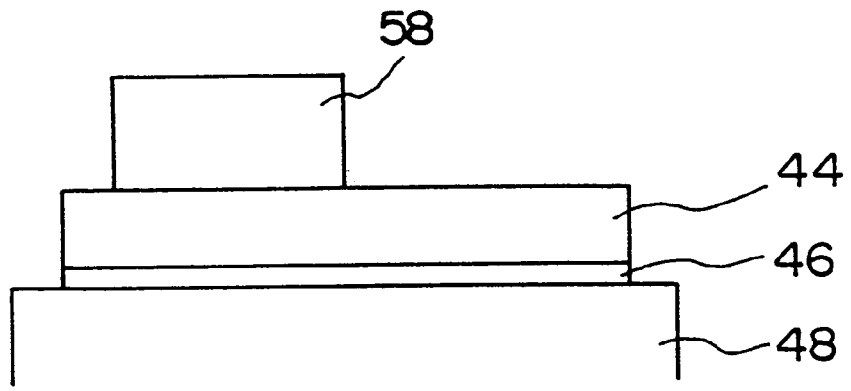
FIG. 9 is a diagram showing an operation of the wafer grinding section of the present invention.

FIG. 9 shows the back grinding process implemented on the wafer 44 using the grinding tool 58. The wafer 44 is ground on its back surface so as to provide a desired thickness (e.g. 300 μm). During the back grinding process, in order to remove scraps and to cool the wafer 44, a cleaning liquid is supplied to the back surface from a nozzle (not shown).

Also when implementing this back grinding process, the wafer 44 is provided with the UV tape 46. The UV tape 46 acts as a protection tape for protecting semiconductor elements mounted on the wafer 44. Therefore, the wafer 44 will not be damaged even when subjected to a back grinding process, which is a machining process.

In the present embodiment, it is the grinding tool 58 that is rotated. However, it is also possible to implement the back grinding process by making the first chuck table 48 rotatable and thereby rotating the wafer 44.

After completion of the back grinding process at the wafer grinding section 18, the first vacuum device ceases the vacuum holding process. This makes it possible for the wafer 44 to be removed from the chuck table 48. Then the second transfer machine 54 provided below the partition 40 is driven so as to transfer the wafer 44 to the drying section 38.

The drying section 38 generally includes a third transfer machine 56, a second chuck table 64, a second vacuum device 66, an ultraviolet (UV) irradiation device 68, a remover 70 and a storage cassette 72.

As described above, the wafer 44 is transferred to the drying section 38 by the second transfer machine 54. However, in the present embodiment, the wafer is not directly mounted on the chuck table 64, but is held at a predetermined distance above the chuck table 64. In other words, the second transfer machine 54 also acts as a holder, which holds the wafer at a predetermined distance above the chuck table 64.

Figure 10:
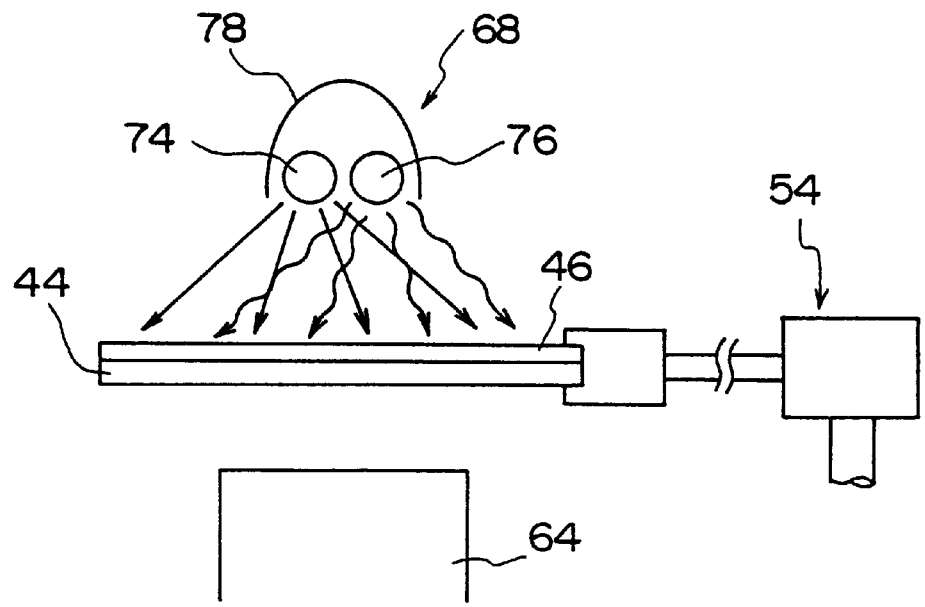
FIG. 10 is a diagram showing an operation of the drying section of the present invention.

Subsequently, an ultraviolet irradiation process is implemented by the UV irradiation device 68 as shown in FIG. 10. The UV irradiation device 68 includes an ultraviolet (UV) lamp 74, a halogen lamp 76, a reflector 78 and a nitrogen gas spray nozzle (not shown). The UV irradiation device 68 is placed so as to oppose the wafer 44, which is held at a predetermined distance above the chuck table 64.

The UV lamp 74 emits ultraviolet rays and the halogen lamp 76 emits a heat wave. The ultraviolet rays produced by the UV lamp 74 and the heat wave produced by the halogen lamp 76 both irradiate the wafer 44. The reflector 78 is provided for efficiently irradiating the wafer 44 by reflecting the ultraviolet rays and the heat wave onto the wafer 44.

The above described adhesive agent provided on the UV tape 46 becomes stiff by being irradiated with the ultraviolet rays. Therefore the adhesive agent becomes less adhesive when the UV tape is irradiated with the ultraviolet rays. Thus, the UV tape 46 can be easily peeled off from the wafer 44.

Also, the wafer 44 is heated to the temperature of 90–140 degrees Celsius by the halogen lamp 76 and nitrogen gas is sprayed on the wafer 44 from the nozzle. Thus the wafer can be efficiently dried within a short period. It should be noted that since the wafer 44 is held at a predetermined distance above the second chuck table 64, the nitrogen gas will also be supplied on the back surface of the wafer 44 (i.e. the surface opposing the second chuck table 64). This enables the wafer 44 to be dried from both sides, thereby improving the efficiency of the drying process.

As described above, in the present embodiment, the UV irradiation device 68 for irradiating the UV tape 46 with the ultraviolet rays is integrated in the drying section 38. Therefore, the ultraviolet sensitive adhesive agent provided on the UV tape 46 may become stiff at an early stage after completion of the wafer grinding process. Because the above described wafer grinding section 36 and the drying section 38 are both provided within the same wafer grinder 30, the adhesive agent provided on the UV tape 46 will not become stiff due to extraneous light such as the light from a fluorescent lamp.

Accordingly, the adhesive agent will not remain on the wafer 44 when peeling off the UV tape 46 from the wafer 44. Also, the cleaning process required is no longer necessary since there is no need for removing the residual adhesive agent from the wafer 44. Thus, the semiconductor device manufacturing process may be simplified.

In the present embodiment, the UV irradiation device 68 is integrated in the drying section 38. Therefore, the overall size of the device required for implementing the back grinding process may be reduced as compared the related art, since the UV irradiation device and the wafer grinder were provided separately in the related art.

Also in the present embodiment, the UV irradiation device 68 is provided so as to oppose the wafer 44. Thereby, the drying process and the UV irradiation process can be carried out simultaneously, thus improving the efficiency of the semiconductor manufacturing process and reducing processing time.

It is also possible to implement the UV irradiation process and the drying process with the wafer 44 being mounted on the second chuck table 64. It is advantageous to provide the surface area of the second chuck table 64 to be smaller than that of the wafer 44. Thus, a part of the surface of the wafer 44 opposing the second chuck table 64 will be exposed during the drying process. Therefore the efficiency of the drying processes may be improved.

As described above, after completion of the ultraviolet irradiation process and the drying process on the wafer 44 by the UV irradiation device 68, the second transfer device 54 mounts the wafer 44 on the second chuck table 64. Then the second vacuum device 66 starts the vacuum process so as to fix the wafer 44 on the second chuck table 64. During the transfer process, the wafer 44 is reversed. Therefore, the wafer 44 is fixed on the second chuck table with the surface provided with the UV tape 46 (the back surface) facing upwards.

Subsequently, the remover 70 is driven. The remover 70 includes an adhesive tape 80, a supply spool 82 and a take-up spool 84. The remover 70 is movable in a vertical direction and in a direction perpendicular to the plane of the Figure by means of a shifting device (not shown).

In the above described ultraviolet irradiation process and the drying process, the moving device moves the remover 70 to a clear position. When implementing the removing process (peeling off the UV tape 46 from the wafer 44), the shifting device moves the remover 70 to a position opposing the wafer 44.

The adhesive tape 80 is formed of a flexible base film provided with a strong adhesive agent. The adhesive tape 80 is wound on the supply spool 82 and the take-up spool 84, and is forwarded from the supply spool 82 to the take-up spool 84. The surface of the adhesive tape 80 having the adhesive agent is placed so as to oppose the wafer 44.

Figure 11:
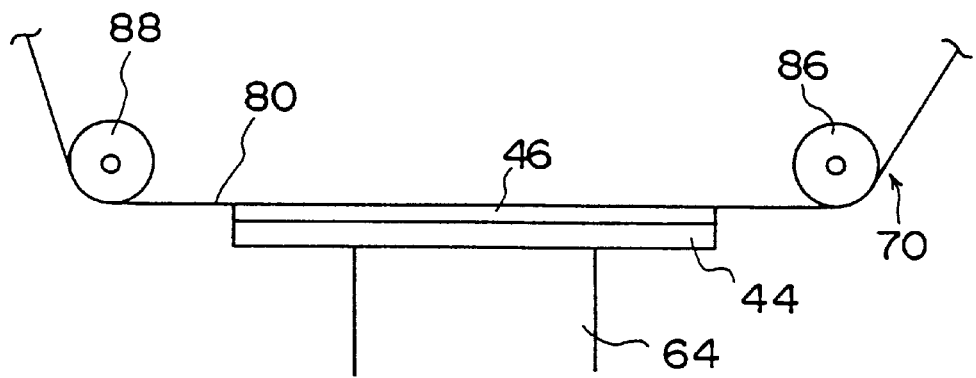
FIG. 11 is a diagram showing an operation of the remover of the present invention.

The UV tape 46 is peeled off from the wafer 44 by means of the remover 70 as described below. First, as shown in FIG. 11, the adhesive tape 80 is pressed onto the UV tape 46 by lowering the remover 70 towards the wafer 44. Thereby, the UV tape 46 will be stuck on the adhesive tape 80.

Figure 12:
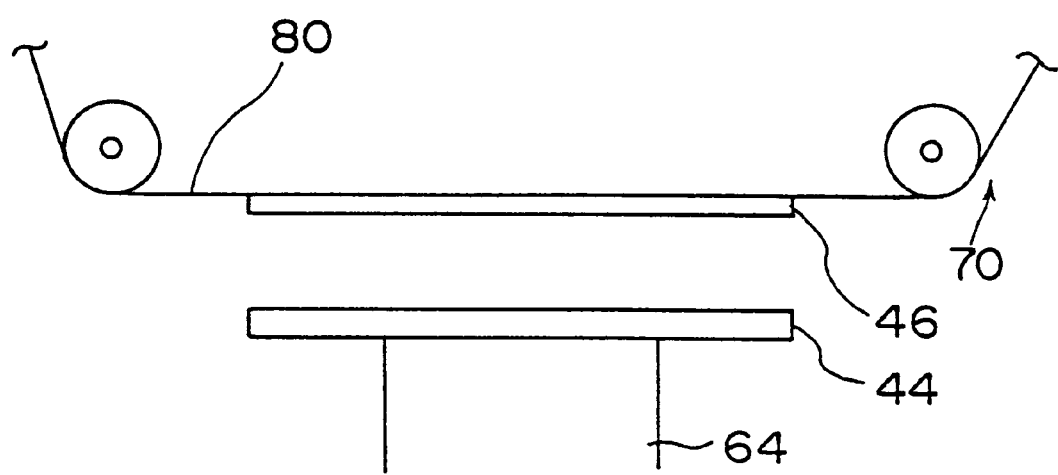
FIG. 12 is a diagram showing a second operation of the remover of the present invention.

As shown above, the adhesive agent provided on the UV tape 46 is less adhesive due to the UV irradiation. That is to say, the adhesiveness of the UV tape 46 against the wafer 44 is less than the adhesiveness of the adhesive tape against the wafer 44. Accordingly, when the remover 70 is raised from the position shown in FIG. 11 by means of the shifting device, the UV tape 46 will peel off from the wafer 44. As shown in FIG. 12, the UV tape 46 will be stuck on the adhesive tape 80. By implementing the above process, the UV tape 46 can be peeled off from the wafer 44. The UV tape 46 stuck on the adhesive tape 80 will be wound on the take-up spool 84 along with the adhesive tape 80.

As shown above, in the present embodiment, the remover 70, which peels off the UV tape 46 from the wafer 44, is integrated in the drying section 38. Therefore, the overall size of the apparatus required for implementing the back grinding process may be reduced as compared to the related art, in which the remover and the wafer grinder were separately provided.

Further, the present invention is not limited to these embodiments, but variations and modifications may be made without departing from the scope of the present invention.

What is claimed is:

1. An apparatus for manufacturing a semiconductor device comprising:

a wafer grinding section which grinds a wafer fixed on an ultraviolet sensitive tape; and a drying section which dries said wafer after said wafer is ground, wherein said drying section comprises an ultraviolet irradiation device irradiating said ultraviolet sensitive tape with ultraviolet rays.

2. The apparatus for manufacturing a semiconductor device as claimed in claim 1, wherein said ultraviolet irradiation device is provided so as to oppose a predetermined wafer drying position within said drying section.

3. The apparatus for manufacturing a semiconductor device as claimed in claim 1, wherein said drying section further comprises a chuck table mounting said wafer, said chuck table having a surface area smaller than that of said wafer.

4. The apparatus for manufacturing a semiconductor device as claimed in claim 1, wherein said drying section further comprises a holder that holds said wafer at a predetermined distance above said chuck table during said drying process.

5. The apparatus for manufacturing a semiconductor device as claimed in claim 1, further comprising a transfer machine that automatically transfers said wafer from said wafer grinding section to said drying section within the apparatus.

6. The apparatus for manufacturing a semiconductor device as claimed in claim 1, wherein said ultraviolet irradiation device comprises both an ultraviolet lamp and a halogen lamp.

7. The apparatus for manufacturing a semiconductor device as claimed in claim 1, wherein said drying section further comprises a remover which peels off said ultraviolet sensitive tape from said wafer, said ultraviolet sensitive tape having been irradiated with ultraviolet rays by said ultraviolet irradiation device and having become stiff.

8. A method of manufacturing a semiconductor device comprising the steps of:

a) grinding a wafer fixed on an ultraviolet sensitive tape;

b) drying said wafer after said step a); and c) irradiating said ultraviolet sensitive tape with ultraviolet rays while drying said wafer.

9. The method of manufacturing a semiconductor as claimed in claim 8, further comprising the step of peeling off said ultraviolet sensitive tape from said wafer after said step c).

* * * * *